United States Patent [19]

Evans et al.

[11] Patent Number: 5,501,761
[45] Date of Patent: Mar. 26, 1996

[54] METHOD FOR STRIPPING CONFORMAL COATINGS FROM CIRCUIT BOARDS

[75] Inventors: Jeffrey J. Evans, Milltown, N.J.; Leslie A. Guth, Newtown, Pa.; Urmi Ray, Plainsboro, N.J.

[73] Assignee: AT&T Corp., Murray Hill, N.J.

[21] Appl. No.: 324,550

[22] Filed: Oct. 18, 1994

[51] Int. Cl.⁶ .................................................. B32B 35/00
[52] U.S. Cl. ........................ 156/344; 134/1.2; 134/1.3; 134/038; 29/402.06; 29/426.4
[58] Field of Search .................. 156/344; 29/402.06, 29/426.1, 426.4; 134/1.2, 1.3, 7, 38

[56] References Cited

U.S. PATENT DOCUMENTS 5,070,603  12/1991  Waldsmith .................. 29/426.4 X
5,088,008   2/1992  Takeyama et al. .................. 361/403
5,236,602   8/1993  Jackson .......................... 210/748

OTHER PUBLICATIONS

Moxley, Western Electric Technical Digest No. 36, Oct. 1974, pp. 27–28.
V. Krukonis, "Processing of Polymers With Supercritical Fluids" 1985, pp. 7–16, Polymer News, vol. 11.

*Primary Examiner*—Mark A. Osele

[57] ABSTRACT

In preparation for removing a protective adherent covercoat from a circuit board that is to be repaired, the surface integrity of the coating is altered (for example, by making incisions therein). Subsequently, the coated circuit board is subjected to supercritical carbon dioxide in a processing chamber. Following this process, the coating is easily lifted from the board.

13 Claims, 1 Drawing Sheet

METHOD FOR STRIPPING CONFORMAL COATINGS FROM CIRCUIT BOARDS

BACKGROUND OF THE INVENTION

This invention relates to component-carrying circuit boards and, more particularly, to a method for removing conformal covercoats from such boards.

Circuit boards that comprise a substrate on which electronic components are mechanically mounted and electrically interconnected are extensively used in a wide variety of practical applications. To protect the components on the substrate from deleterious environmental factors, it is common practice to cover the entire surface of the component-carrying substrate with a protective coating. Such a protective coating is formed, for example, by spraying a layer of a suitable polymer material onto the surface of the component-carrying substrate.

Each coated circuit board is typically individually tested before connecting it into an overall system assembly. If such testing reveals a fault in the circuit contained on the board, it is necessary to remove the protective coating to gain access to the components and interconnections on the board. Following a repair step, the board is recoated and then retested.

Heretofore, known processes such as plasma cleaning have been employed to remove the protective coating from a faulty circuit board. But, especially because of the extremely long times (many hours) typically required for removal of the coating, such known processes are not, in practice, cost effective.

Thus, it was recognized that a need existed for a more effective way (in particular, a faster way) for removing the conformal coating from a circuit board that is to be repaired. It was apparent that such a removal technique, if available, would be of significant practical importance in contributing to lowering the cost of manufacturing circuit boards and of the systems in which the boards are utilized.

SUMMARY OF THE INVENTION

In accordance with the principles of the present invention, supercritical carbon dioxide is utilized to remove a polymer coating from a circuit board. In preparation for removal of the coating, the surface integrity of the coating is altered prior to subjecting it to the supercritical carbon dioxide.

In particular, the present invention comprises a method for removing a conformal coating from a circuit board. In one embodiment, the method comprises the step of forming at least one incision in the coating and then subjecting the coated circuit board to supercritical carbon dioxide in a processing chamber. Thereafter, the treated coating is easily lifted from the board.

BRIEF DESCRIPTION OF THE DRAWING

A complete understanding of the present invention and of the above and other features and advantages thereof will be apparent from the detailed description below taken in conjunction with the accompanying drawing, not drawn to scale, in which.

DETAILED DESCRIPTION

Figure 1:
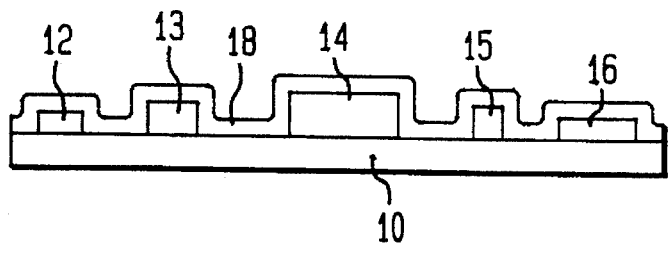
FIG. 1 is a side view of a conventional component-carrying circuit board that has been covered with a protective coating.

By way of example, FIG. 1 shows a specific illustrative component-carrying circuit board of a type well known in the art. The board comprises a conventional substrate 10 having multiple components 12 through 16 (transistors, resistors, capacitors, etc.) mechanically mounted thereon. These components are electrically connected together on the board to form a subassembly that is designed to be interconnected with other circuit boards in an overall system assembly.

As indicated in FIG. 1, the components 12 through 16 on the substrate 10 are advantageously covered with a conformal coating 18 whose purpose is to protect the depicted subassembly from deleterious influences such as moisture, mechanical damage, etc. Many different commercially available materials are suitable for forming the coating 18. In particular, a variety of ultraviolet- or heat-curable high-molecular-weight polymers have been found to be effective for forming an adherent protective coating. More specifically, a layer of a standard polymer material comprising, for example, parylene (a tradename of Union Carbide), urethane, silicone or other known resin is efficacious to protect the depicted circuit board. These materials can be applied to the circuit board in various standard ways such as, for example, by spraying, dipping or brushing.

In one specific illustrative example, the X and Z dimensions of the substrate 10 of FIG. 1 were each approximately twenty centimeters (cm). In that particular case, the Y-direction thickness of the substrate 10 was about five millimeters (mm), and the Y-direction thickness of the protective coating 18 was approximately 1.6 mm.

In practice, each completed subassembly comprising a coated circuit board of the type shown in FIG. 1 is individually tested before connecting it into a system assembly. If testing reveals that a fault exists in the circuit board, it is common practice to attempt to salvage the board by repairing it. In that way, the necessity of discarding complex and costly boards can often be avoided.

To repair a faulty circuit board, it is necessary to remove all or at least a portion of the protective coating 18 (FIG. 1). In that way, access can be gained to the components 12 through 16 and to the electrical connections therebetween.

Heretofore, various techniques have been employed to remove the protective coating 18. One such specific technique, known as plasma cleaning, involves exposing the coating to ionized argon gas. But in practice plasma cleaning has been found to be extremely slow. To remove a 1.6 mm-thick coating of parylene by utilizing conventional plasma techniques requires, for example, about seven hours. A variety of other standard removal processes have also been determined to be unacceptably slow, environmentally unsafe or injurious to the components and/or interconnections on the circuit board.

In accordance with the principles of the present invention, the protective coating 18 shown in FIG. 1 is removed by exposing it to supercritical carbon dioxide (SC—$CO_2$). Prior to such exposure, the coating is, for example, incised to facilitate its removal, as will be described in detail below. Illustratively, exposure of the coating to SC—$CO_2$ is accomplished by immersing the entire circuit board in SC—$CO_2$ in a standard processing chamber.

SC—$CO_2$ is a well known substance. It is used, for example, as a cleaner for removing organic or inorganic contaminants in various manufacturing operations in the electronics industry. $CO_2$ becomes supercritical at temperatures above 31 degrees Celsius and pressures above 1073 pounds per square inch. In the supercritical state, $CO_2$ is as dense as a liquid but still retains gas-like properties of high diffusivity and low viscosity. Importantly, $SC-CO_2$ has been determined to be capable of dissolving polymer materials of the type typically employed to form the coating 18 (FIG. 1).

Utilizing $SC-CO_2$ as a removal agent for the coating 18 has several attractive advantages. For example, $SC-CO_2$ is non-toxic, non-flammable and environmentally safe. Also, it does not contain any hydrogen or halogen and hence does not corrode metal parts. Further, $SC-CO_2$ evaporates rapidly (it is a gas at room temperature) and thus there is no need to allow drying time in the removal operation. Additionally, $SC-CO_2$ accomplishes removal of the protective coating without leaving any harmful residues on the surface of the circuit board. Furthermore, because of its near-ambient critical temperature, minimal heating of $CO_2$ is required to produce the supercritical state. Hence, the chances of thermally activating degradative processes on a circuit board during the removal process are extremely low.

In accordance with the principles of the present invention, a circuit board having a conformal adherent protective coating that is to be removed is treated before subjecting it to $SC-CO_2$. By such treatment, the $SC-CO_2$ removal process is significantly accelerated and thereby rendered economically attractive.

Figure 2:
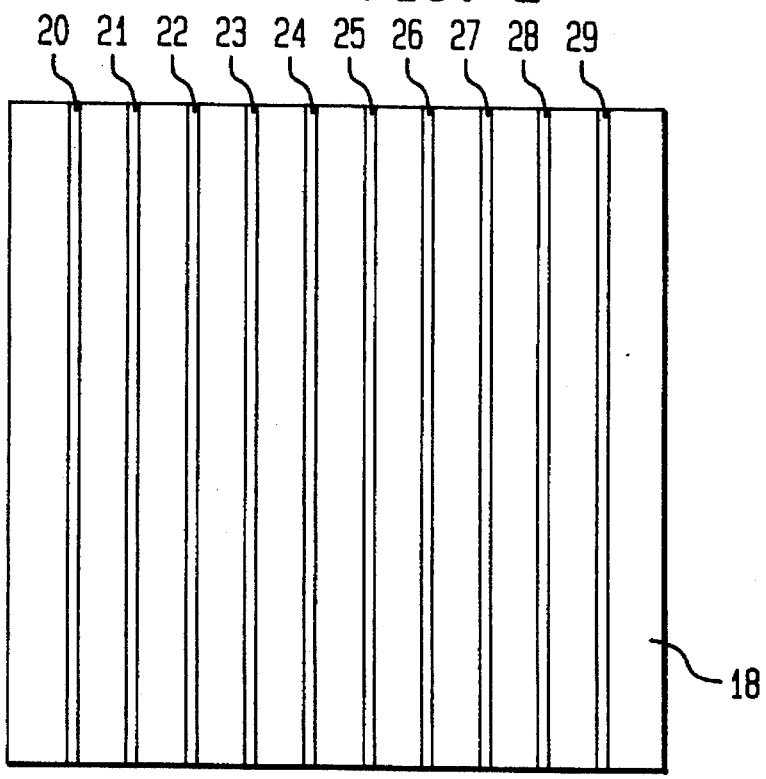
FIG. 2 is a top view of the FIG. 1 board showing incisions that have been made in the protective coating in accordance with the principles of the present invention.

Localized thinning of the protective coating 18 prior to subjecting it to $SC-CO_2$ involves, for example, forming one or more incisions in the coating. In accordance with the invention, incisions are made with any suitable instrumentality such as, for example, a mechanical cutting tool such as a razor knife or by means of a laser beam. Multiple such incisions made in the coating 18 are depicted in FIG. 2 and designated by reference numerals 20 through 29. Programming a scanning laser beam to impinge upon the surface of the coated circuit board is one advantageous way of rapidly and accurately making the depicted pattern of incisions.

The number and spacing of the incisions made in the protective coating 18 are, however, not critical. Nor are their exact widths critical. Illustratively, for an approximately square circuit board having X and Z dimensions of about twenty cm each, ten incisions such as those designated 20 through 29 are made in the coating 18. As illustratively depicted, these incisions are, for example, approximately equally spaced apart, and each extends over the entire Z-direction extent of the coating.

A systematic regular array of incisions of the particular type represented in FIG. 2 may be advantageous in some cases. But such specific and ordered regularity is not essential. A more randomly oriented and spaced set of incisions will often suffice. And, furthermore, in a regular array of the FIG. 2 type, incisions may, of course, also, or alternatively, extend parallel to the depicted X direction.

Furthermore, as mentioned earlier above, repair of a faulty circuit board may not require removal of the entire protective coating. Thus, for example, if a fault is diagnosed as being attributable to a component and/or interconnection located in a particular region of the component-carrying substrate, only the portion of the coating overlying that particular region need be removed. In that case, one or more incisions would be made only in that particular portion of the coating.

The X-direction width of each of the incisions 20 through 29 shown in FIG. 2 is determined by the type of instrumentality utilized to form the incisions. In one particular illustrative case, the width of each of these incisions was about 0.8 mm.

Advantageously, the depths of the incisions made in the protective coating are controlled to avoid cutting through the entire thickness of the coating. Illustratively, the incisions are controlled such that their depths extend through only some major specified portion of the thickness of the coating. In that way, the possibility of the cutting operation causing damage to components and/or interconnections on the circuit board is avoided.

Figure 3:
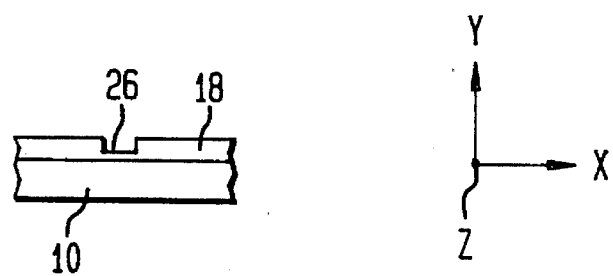
FIG. 3 is a side view of a portion of the FIG. 2 board, showing one of the incisions made in the coating.

FIG. 3 illustrates in part the result of the aforedescribed cutting technique according to which each of the incisions made in the protective coating 18 is advantageously controlled so as not to extend through the entire thickness of the coating. In FIG. 3, one of the incisions (designated with the reference numeral 26) formed in the coating 18 is shown. By way of a specific illustrative example, the depth or Y-direction extent of the incision 26 is controlled to be about 80 percent of the thickness of the coating 18. Thus, for the case in which the thickness of the coating 18 is about 1.6 mm, the depth of the incision 26 is therefore, for example, controlled to be approximately 1.28 mm.

In other cases, however, for example where the protective coating 18 is made of a transparent material, it is often feasible and advantageous to make the indicated incisions such that they extend through the entire Y-direction thickness of the coating. (The advantage of making such through-cuts in the protective coating is that the length of the subsequent removal step in $SC-CO_2$ will be shortened.) Because of the transparent nature of the coating, it is possible to locate the through-incisions in regions of the coating that do not overlie components and/or interconnections. In that way, the chances of damaging the circuit board during the incising step are extremely low.

In accordance with the invention, a circuit board whose protective coating has been incised is then exposed to $SC-CO_2$. Illustratively, this is done by immersing the board in a vessel containing $SC-CO_2$ in a standard processing chamber. In one specific exemplary case, $SC-CO_2$ was formed in the vessel when $CO_2$ was introduced therein and the pressure in the chamber was established at approximately 1500 pounds per square inch and the temperature therein was established at about 40 degrees Celsius. In practice, pressures above 1073 pounds per square inch up to about 5000 pounds per square inch, and temperatures above 31 degrees Celsius up to approximately 70 degrees Celsius, are feasible to produce the desired form of $CO_2$.

As mentioned earlier above, $SC-CO_2$ is characterized by the advantageous property of high diffusivity. Accordingly, after dissolving any coating material remaining at the bottom of incisions (see, for example, incision 26 in FIG. 3), $SC-CO_2$ acting on an immersed circuit board in the processing chamber is effective to diffuse laterally in a relatively rapid manner along the interface that exists between the bottom of the protective coating 18 and underlying portions of the board. Such diffusion emanates from each incision formed in the coating 18. In that way, adhesion bonds between the bottom surface of the coating 18 and underlying portions of the board are rapidly dissolved.

In the specific illustrative case mentioned above (1500 pounds per square inch and 40 degrees Celsius), substantially all the adhesion bonds between a 1.6-mm-thick protective coating made of parylene and an associated 20-cm by 20-cm component-carrying substrate were dissolved in $SC-CO_2$ in the processing chamber in only about 45 minutes. Subsequently, following removal of the circuit board from the processing chamber, the coating was easily lifted from the board (for example by tweezers).

Finally, it is to be understood that the above-described arrangements and procedures are only illustrative of the principles of the present invention. In accordance with these principles, numerous modifications and alternatives may be devised by those skilled in the art without departing from the spirit and scope of the invention. Thus, for example, although primary emphasis herein has been directed to incising the aforedescribed protective coating before subjecting it to SC—$CO_2$, it is feasible and effective to employ other techniques to alter the surface integrity of the coating and thereby prepare it for exposure to SC—$CO_2$. Illustratively, such other localized thinning techniques include abrading or puncturing the surface of the coating prior to subjecting the coating to SC—$CO_2$.

What is claimed is:

1. A method for removing a conformal coating from a circuit board, said method comprising the steps of locally thinning said coating, and then subjecting said coated circuit board in a processing chamber to supercritical carbon dioxide.

2. A method as in claim 1 wherein said thinning step comprises forming at least one incision in said coating.

3. A method as in claim 2 wherein carbon dioxide is introduced into said chamber, the pressure within said chamber is established between 1073 and 5000 pounds per square inch and the temperature within said chamber is established between 31 and 70 degrees Celsius.

4. A method as in claim 3 wherein the pressure within said chamber is established at 1500 pounds per square inch and the temperature therein is established at 40 degrees Celsius.

5. A method as in claim 4 wherein said coating comprises a high-molecular-weight polymer material.

6. A method as in claim 2 wherein said incisions are made by a mechanical cutting tool.

7. A method as in claim 6 wherein said mechanical cutting tool comprises a razor knife.

8. A method as in claim 2 wherein said incisions are made by a laser beam.

9. A method as in claim 8 wherein said incisions are made by a programmed scanning laser beam.

10. A method as in claim 2 wherein the depths of the incisions made in said coating are less than the thickness of said coating.

11. A method as in claim 2 wherein said incisions are made only in a localized portion of said coating.

12. A method as in claim 4 wherein the coated circuit board is subjected to supercritical carbon dioxide in said chamber for about 45 minutes.

13. A method as in claim 12 wherein, after the circuit board is removed from said processing chamber, the coating is lifted from the board with tweezers.

* * * * *